United States Patent [19]

Ramirez

[11] Patent Number: 5,731,760
[45] Date of Patent: Mar. 24, 1998

[54] APPARATUS FOR PREVENTING ACCIDENTAL OR INTENTIONAL FUSE BLOWING

[75] Inventor: Sergio R. Ramirez, Austin, Tex.

[73] Assignee: Advanced Micro Devices Inc., Sunnyvale, Calif.

[21] Appl. No.: 652,640

[22] Filed: May 31, 1996

[51] Int. Cl.$^6$ ................................................. G08B 21/00
[52] U.S. Cl. .................... 340/638; 340/639; 365/225.7; 327/525
[58] Field of Search .................... 340/638, 635, 340/639; 365/96, 196, 201, 225.7, 189.7; 327/525

[56] References Cited

U.S. PATENT DOCUMENTS

| | | | |
|---|---|---|---|
| 5,276,653 | 1/1994 | McKenny | 365/225.7 |
| 5,293,564 | 3/1994 | Sukegawa et al. | 365/201 |
| 5,384,727 | 1/1995 | Moyal et al. | 365/96 |
| 5,404,049 | 4/1995 | Canada et al. | 365/525 |
| 5,412,594 | 5/1995 | Moyal et al. | 365/96 |
| 5,517,455 | 5/1996 | McCure et al. | 365/225.7 |

Primary Examiner—Jeffery Hofsass
Assistant Examiner—Julie B. Lien
Attorney, Agent, or Firm—Foley & Lardner

[57] ABSTRACT

A fuse protection and fuse blowing circuit includes a fuse register which has an additional fuse with respect to other fuse registers used in the system. The additional fuse has an output which indicates a blown/not blown state of the additional fuse, and that output is fed back to a blow enable input of each of the other fuses in the fuse register and the other fuse registers. When the additional fuse is set to the blown state, none of the other fuses are allowed to be blown, thereby protecting the device against any accidental blowing of fuses.

14 Claims, 4 Drawing Sheets

APPARATUS FOR PREVENTING ACCIDENTAL OR INTENTIONAL FUSE BLOWING

BACKGROUND OF THE INVENTION

1. Field of the Invention

The present invention relates to an apparatus for preventing accidental or intentional fuse blowing. In particular, the present invention relates to an apparatus for preventing accidental or intentional fuse blowing in a subscriber line audio processing circuit (SLAC) and/or a device used in the SLAC family.

2. Description of the Related Art

It is well known in the art of integrated circuit design to use one or more fuses, in conjunction with other fuses and circuit elements, to set a circuit parameter such as a voltage, a current, or a voltage or current gain. Fuses generally have an intact, or uninterrupted, state and a blown, or interrupted, state. In the intact state, the fuse is a low resistance element capable of conducting current. In the blown state, the fuse has a very high resistance and generally does not conduct current. When used in conjunction with other circuit elements to set a circuit parameter, the fuse may be configured so that its unblown state corresponds to a first value of a circuit parameter, and its blown state corresponds to a second value of the circuit parameter.

Fuse trimming circuits are commonly used in analog circuit devices. Such analog integrated circuits may include digital signal processors, telecommunications devices, and operational amplifiers. Such telecommunications devices include subscriber line interface circuits (SLICs) and subscriber line audio processing circuits (SLACs). The SLIC is generally included as part of a programmable electronic telephone line card. The programmable electronic telephone line card also generally includes a SLAC. The SLAC handles analog-to-digital signal conversion and digital-to-analog signal conversion, filtering, and interfacing with a pulse code modulation (PCM) highway. Such devices are described in "Integrated Ring Detection Circuit and Power Cross Detection Circuit With Persistence Timers", U.S. Ser. No. 08/483,868, invented by W. Schopfer, and assigned to AMD Inc., which is incorporated herein by reference.

In analog integrated circuits, it is often desirable to precisely trim circuit parameters to a predetermined range of values. While analog integrated circuits may be designed to produce such parameters within a certain range of values, variations in manufacturing processes may produce an unacceptably wide tolerance level for parameters after manufacturing. Accordingly, it is well known to use fuse trimming to improve the tolerance range of analog integrated circuit parameters for high performance applications.

Generally, fuses have been fabricated on the surface of an integrated circuit device directly adjacent to and in electrical contact with a large area of metal known as a probe pad. The fuse is fabricated from one of the conductor layers used in the integrated circuit device, such as a metal layer or a low-resistance polysilicon layer. The fuse is generally formed of a narrow strip of the conductor layer. When the current through the fuse exceeds a predetermined amount, the fuse "blows" by interrupting the strip of conductor layer. The final passivation layers of the integrated circuit device must be removed from the probe pad to allow direct contact with the probe pad by a probe.

As noted above, a first end of a fuse is in electrical contact with the probe pad, and a second end of the fuse is electrically connected to another node on the integrated circuit device, such as a ground. In such conventional devices, the first end of the fuse is also connected through a resistor to a second circuit node, such as the most positive potential in the circuit, or VCC. This first end of the fuse is also connected to circuitry for sensing the voltage present at the first end of the fuse and for generating a desired circuit parameter. With the low resistance fuse intact, and with power supplied to the integrated circuit, the first end of the fuse will be pulled to the same potential as the second end of the fuse, or ground. Current will then flow through the resistor from VCC, causing a potential drop across the resistor.

In response to the VCC level present at the first end of the fuse, the circuitry coupled to the first end will generate a circuit parameter such as a current or voltage having a first value. When it is determined that this first value is outside of a predetermined range of values, the fuse will be blown. To blow the fuse, a probe contacts the probe pad and supplies sufficient voltage and current across the fuse to cause the fuse to blow, converting the fuse from its intact state to its blown state. With the fuse in its blown state, no current flows through the fuse, and the resistor serves as a pull-up resistor, pulling the potential at the first end of the fuse to VCC. When the circuitry coupled to the first end of the fuse detects the VCC potential, the circuitry produces the circuit parameter at a second value.

In a conventional SLAC system, in order to trim a SLAC or a SLAC-family device, fuses are blown when a blow fuse signal and a fuse enable signal are both at a logic "high" level. FIG. 1 shows such a structure of a conventional SLAC fuse-blowing system, which includes an 8-bit FSDB signal bus and a 12-bit FSRDWR signal bus (both being outputs of a control circuit, not shown). The 8-bit FSDB signal bus contains the data that is to be read into the Fuse Registers 10, 12, 14 and 15. The 12-bit FSRDWR signal bus contains the signals used to control reading, writing, resetting, fuse enable, and top and bottom bias levels for the fuses in the SLAC. The Fuse Enable input of the Fuse Registers 10, 12, 14 and 15 receives inputs from the zeroth (line 0) signal of the FSRDWR signal bus. The Blow input of the Fuse Registers 10, 12, 14 and 15 receives inputs from the third (line 3) signal of the FSRDWR signal bus.

Placing both the zeroth signal line and the third signal line of the FSRDWR signal bus at a logic high state results in the fuses being blown. The blowing of the fuses in the Fuse Registers results in the signals on the Fuse0 through Fuse5 output lines changing from a logic "low" (i.e., "0") state, indicating a not-blown fuse condition, to a logic "high" state (i.e., "1") state, indicating a blown-fuse condition.

This construction of the fuse blowing procedure for a SLAC makes accidently blowing a fuse difficult. However, such accidental fuse blowing can still occur with the system shown in FIG. 1, for example by accidentally going into a test mode that is used to trim the device.

FIG. 1 also shows a Fuse Bias Register 20, which is also connected to receive the zeroth signal line from the FSRDWR signal bus onto its ENB (enable) input. The Fuse Bias Register 20 outputs a top bias (BIAS_TOP) and a bottom bias (BIAS_BOT) value. The BIAS_TOP and BIAS_BOT values are sent to the BIAS_TOP and BIAS_BOT inputs for each of the Fuse Registers 10, 12, 14 and 15.

U.S. Pat. Nos. 5,384,727, and 5,412,594, both of which are invented by T. Brennan, M. Moyal and G. Vance, and both of which are assigned to AMD Inc., disclose fuse trimming in plastic package devices. Each of these patents, which are incorporated herein by reference, uses a fuse blowing and protection system similar to that shown in FIG. 1, and may be vulnerable to accidental fuse-blowing.

It is desirable to have a fuse-blowing and fuse-protection circuit which reduces the possibilities of accidental fuse-blowing of SLACs.

SUMMARY OF THE INVENTION

An object of the present invention is to allow fuse-blowing during a trimming operation of a SLAC, such that the device is fully protected against accidental fuse blowing.

This and other objects are achieved by a fuse blowing and protection circuit. The circuit includes at least one fuse register configured to store and output a first plurality of fuse signals corresponding to a first plurality of fuses. The at least one fuse register has a fuse enable input and a blow fuse input. The fuse signals are output to indicate a blown fuse condition when the fuse enable input and the blow fuse input are activated simultaneously. The circuit also includes a second fuse register configured to store and output a second plurality of fuse signals corresponding to a second plurality of fuses. The second plurality exceeds the first plurality by one. The second fuse register has a fuse enable input, a blow fuse input, and a blow extra fuse input. All but one of the second plurality of fuse signals are output to indicate the blown fuse condition when the fuse enable input and the blow fuse input are activated simultaneously. A remaining one of the second plurality of fuse signals is output to indicate the blown fuse condition when the fuse enable input and the blow extra fuse input are activated simultaneously. The blow fuse input of the at least one fuse register and the second fuse register is respectively set to a value based on the remaining one of the second plurality of fuse signals.

BRIEF DESCRIPTION OF THE DRAWINGS

These and other objects and advantages of the invention will become more fully apparent from the following detailed description when read in conjunction with the accompanying drawings, with like reference numerals indicating corresponding parts throughout, wherein.

DETAILED DESCRIPTION OF THE PREFERRED EMBODIMENTS

The system according to the invention provides greater protection against accidental fuse blowing of SLAC devices than that provided in conventional devices. The greater protection is achieved by the incorporation of an additional fuse to the fuse blowing and protection circuit. The additional fuse is configured to disable the blowing of all other fuses (except itself). When the SLAC is trimmed (i.e., the desired fuses are blown), the additional fuse is blown, thereby preventing any further blowing of more fuses.

Figure 1:
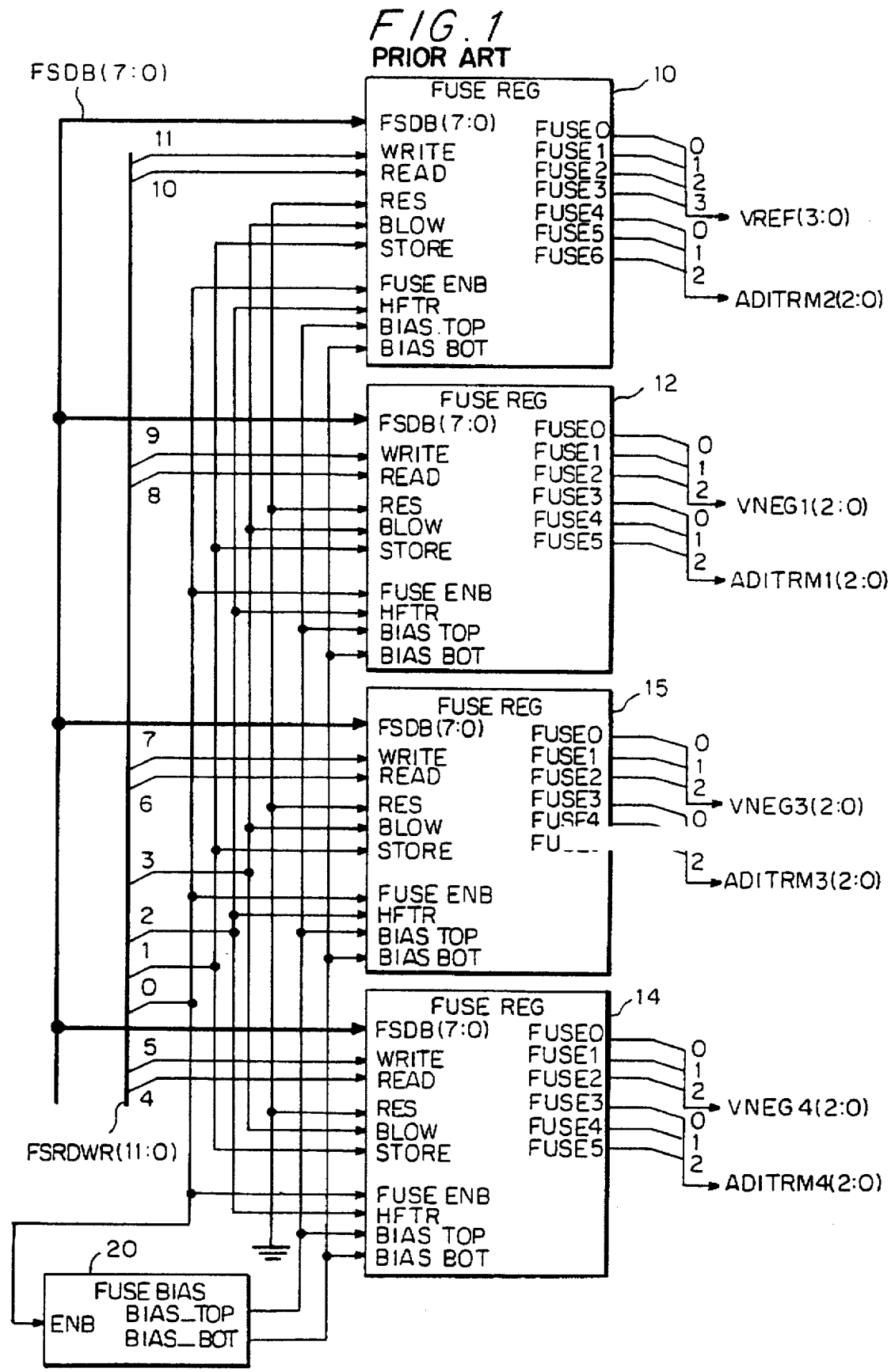
FIG. 1 is a diagram showing a conventional fuse blowing and fuse protection circuit.
Figure 2:
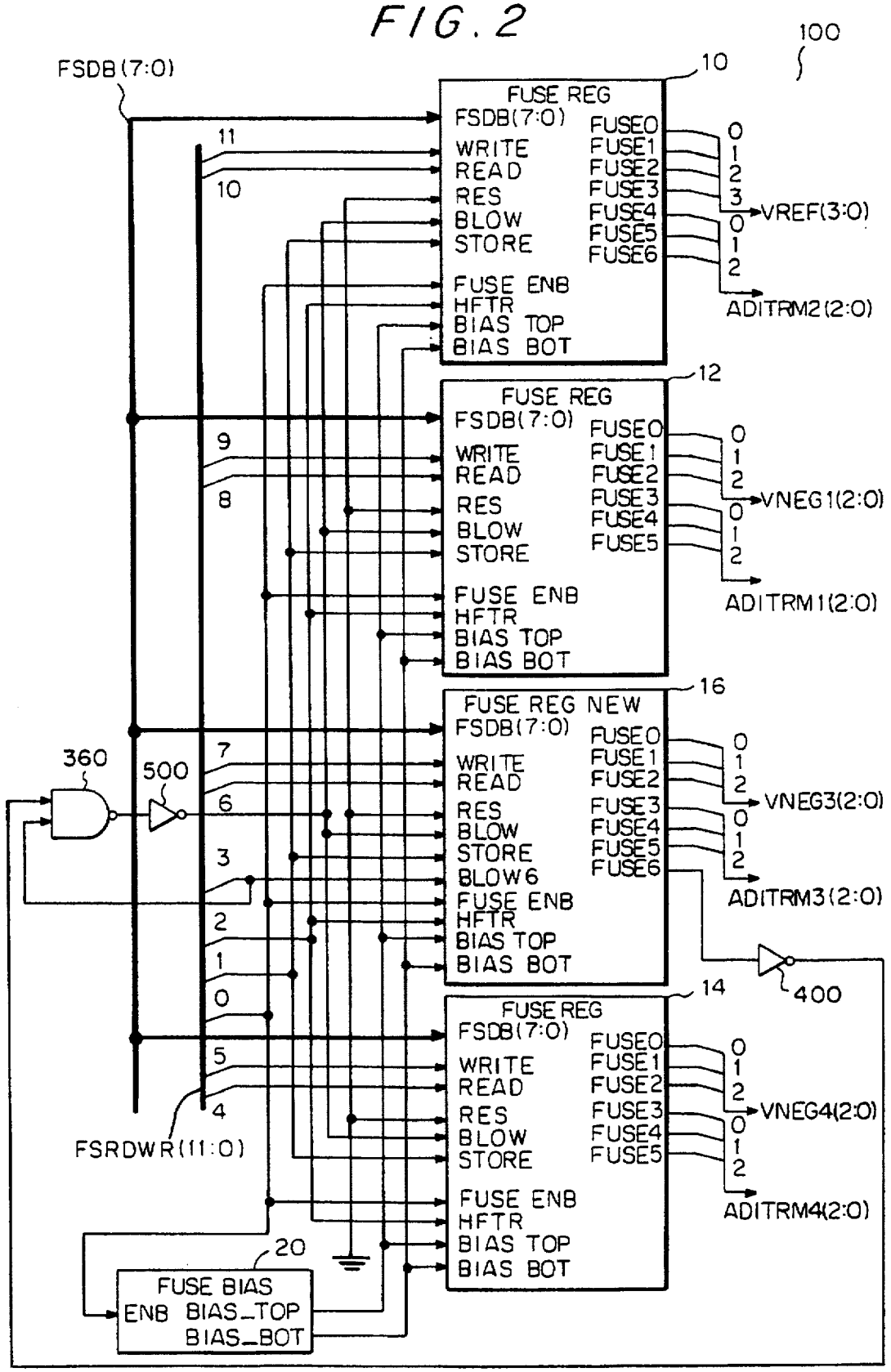
FIG. 2 is a diagram showing a fuse blowing and fuse protection circuit according to the invention.

FIG. 2 shows the fuse blowing and protection device 100 according to the invention. The device 100 includes Fuse Register 10, 12 and 14, which are similar to the Fuse Registers used in the conventional system shown in FIG. 1. The device 100 also includes a Fuse Register 16, which is different from the Fuse Registers 10, 12 and 14 in that it has an extra input, BLOW6, and an extra output, Fuse6. The Fuse6 output corresponds to the newly added fuse, and that output is fed back in a manner described herein to protect against any accidental blowing of fuses in the SLAC. The Fuse6 output of Fuse Register 16 is different from the Fuse6 output of Fuse Register 10 in that the Fuse6 output of Fuse Register 16 is independently controlled by the Blow6 input, which is not available on Fuse Register 10.

The device 100 also includes a Fuse Bias circuit 20, which is similar to that shown and described with reference to FIG. 1, and is not a part of the invention and need not be explained in further detail.

The device 100 further includes an inverter 400, which is coupled between the Fuse6 output of the Fuse Register 16 and a NAND Gate 360. The NAND Gate 360 has two inputs, one input being connected to receive the third signal line from the FSRDWR signal bus, and another input being connected to receive the output signal from the inverter 400.

The output of the NAND Gate 360 is connected to an inverter 500, and the output of the inverter 500 is supplied to the BLOW input of the Fuse Register 16. The output of the inverter is the signal that is fed to the BLOW input of all of the Fuse Registers 10, 12, 14 and 16. With this configuration, accidental blowing of fuses in these Fuse Registers is prevented to a greater extent than that provided in the conventional device shown in FIG. 1.

The signals FSDB(7:0) and FSRDWR(11:0) as shown in FIG. 2 are supplied by a control circuit (not shown), which generates the enable (ENB), reset (RES), read (RD) and write (WR) signals for performing a trimming operation. The control circuit may be under control of one or more predetermined instructions for controlling the timing and application of the control signals, and thus may include a processor and a memory for storing applications programs for performing the requisite control.

Figure 3:
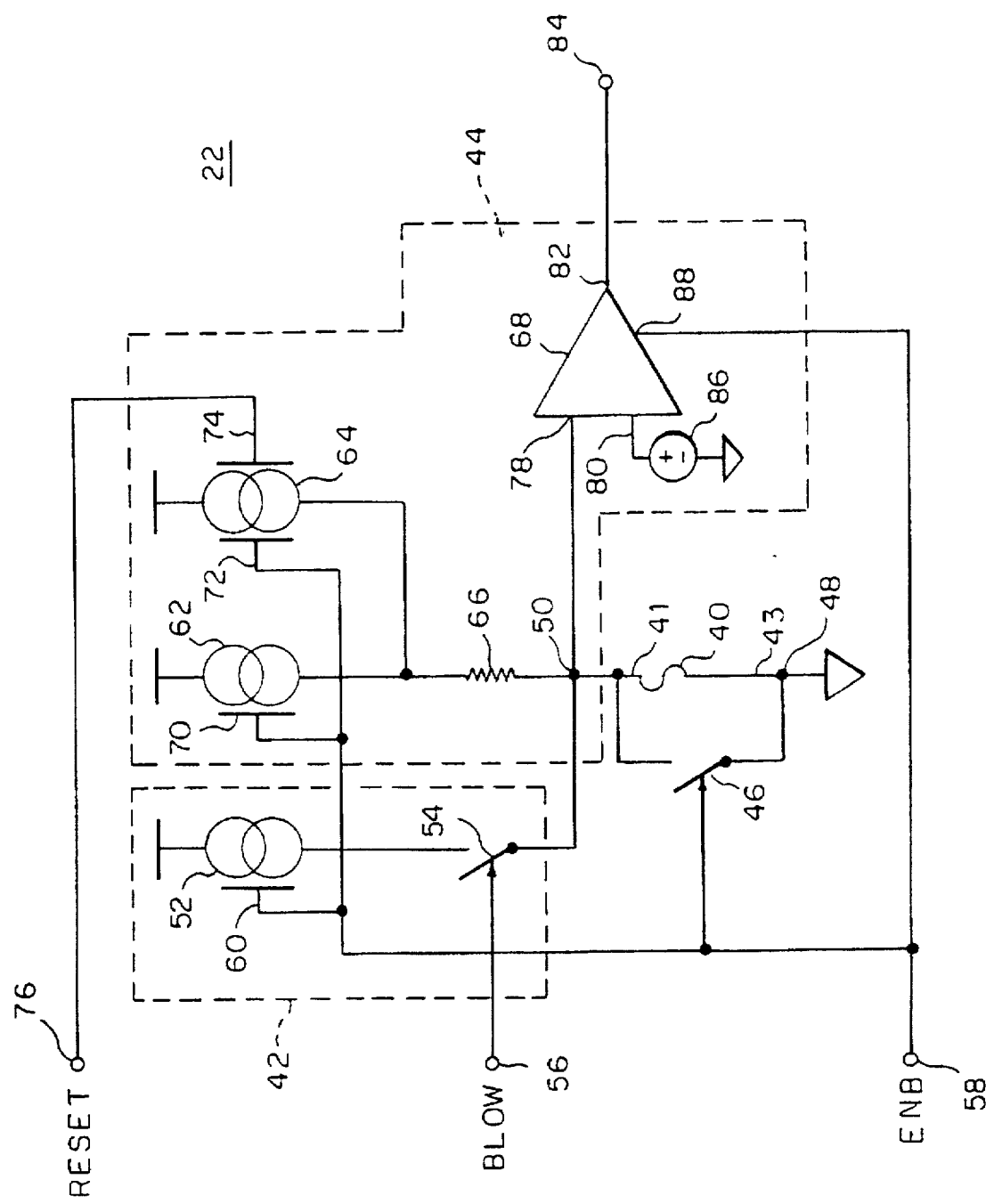
FIG. 3 shows a detailed diagram of a fuse circuit that can be used as part of the fuse register.

FIG. 3 shows a diagram of a fuse circuit which may be used in the system according to the invention. In FIG. 3, the fuse circuit 22 includes a fuse 40, a fuse blowing circuit 42, a fuse reading circuit 44, and a disable switch 46. The fuse circuit 22 has a blow input (BLOW) 56, an enable input (ENB) 58, a reset input (RES) 76 and an output 84.

The fuse 40 may be fabricated from any of the conductor layers forming the integrated circuit of the SLAC and/or SLAC family device. Preferably, the fuse 40 is fabricated from first level polysilicon. The fuse 40 should have a relatively low resistance, preferably 200 ohms, so that in response to low levels of applied current, the fuse 40 appears as a short circuit. In response to high levels of applied current, the fuse 40 preferably blows, converting to a high resistance state having a resistance on the order of 20 megaohms. The fuse 40 has a first end 41 coupled to a first node 50 and a second end 43 coupled to a ground node 48. Thus, the fuse 40 forms an interrupting means for interrupting a circuit, the fuse 40 establishing a potential at the node 50 within the fuse circuit 22. The fuse 40 thus has an interrupted state for establishing the potential at the node 50 at a first potential level and an uninterrupted state for establishing the potential at the node 50 at a second potential level.

The fuse blowing circuit 42 includes a blow current source 52 and a blow switch 54. The blow switch 54 closes in response to a signal applied to the blow input (BLOW) 56 by the control circuit (not shown), as seen in FIG. 2. As illustrated in FIG. 3, the blow current source 52 has a single control input 60 coupled to the ENB input 58. The blow current source 52 thus responds to an enable signal supplied to the ENB input 58 by the control circuit.

In operation, the blow current source 52 responds to the enable signal at the control input 60 to generate a blow current. The blow current is preferably approximately 15 mA, and the blow current source 52 preferably includes a current of this magnitude. The blow current source 52 may also include field effect transistors (not shown) for controlling supply of the blow current. In response to the blow control signal received at the blow input (BLOW) 56, the blow switch 54 closes to couple the blow current source 52 to the fuse 40. Preferably, the blow switch 54 couples the blow current to the fuse 40 for a period of approximately 10 microseconds. The blow switch 54 preferably comprises a field effect transistor (not shown). In response to the blow current, the fuse 40 blows, changing from its intact or uninterrupted state to a blown or interrupted state. Thus, the fuse blowing circuit 42 forms a state altering means operatively connected with the fuse 40 for changing the fuse 40 from its uninterrupted state in response to a first control signal at the blow input (BLOW) 56.

The fuse reading circuit 44 includes an operational current source 62, a test current source 64, a resistor 66 and a comparator 68. The operational current source 62 has a control input 70 coupled to the ENB input 58. In response to a control signal received at the ENB input 58 from the control circuit (not shown), the operational current source 62 supplies a current through the resistor 66 to the fuse 40. This current is preferably approximately 1 microamp. The resistor 66 is preferably approximately 10K ohms, and is preferably a value much larger than the resistance of the fuse 40 when the fuse 40 is in its intact or uninterrupted state.

The test current source 64 has a first control input 72 coupled to the ENB input 58. The test current source 64 supplies a test current only when signals at both the first control input 72 and the second control input 74 are at a high logic level (i.e., logic level "1"). Thus, in response to control signals applied to the RES (reset) 76 and ENB (enable) 58 inputs, the test current source 64 supplies a test current through the resistor 66 to the fuse 40. This current is preferably approximately 100 microamps.

The comparator 68 has a first input 78 coupled to the first end 41 of the fuse 40 at node 50, a second input 80 coupled to a reference voltage source 86, an enable input 88, and an output 82 coupled to the output 84 of the fuse circuit 22. The comparator 68 compares the voltage at the input 78 with the voltage at the input 80. When the voltage at node 50 supplied to the input 78 is greater than the reference voltage supplied by the reference voltage source 86 to the input 80, the comparator 68 generates a voltage at the output 84 having one value of a first value or a second value. When the voltage at node 50 is less than the reference voltage supplied by the reference voltage source 86, the comparator 68 generates a voltage at the output 84 having the other value of the first value and the second value.

The disable switch 46 operates in response to the control signal applied to the ENB input 58. The disable switch 46 preferably comprises a field effect transistor (not shown). When the control signal applied to the ENB input 58 has a value which enables the blow current source 52, the operational current source 62 and the test current source 64, the disable switch 46 opens. When the control signal applied to the ENB input 58 disables the blow current source 52, the operational current source 62 and the test current source 64, so that these current sources do not supply current, the disable switch 46 closes, coupling the node 50 to the ground node 48. In this manner, when the fuse circuit 22 is not in operation, and when no current is supplied to the fuse 40 for blowing or reading or testing, the node 50 is electrically coupled through the fuse 40 to the ground node 58. Thus, when the fuse 40 is not being blown, read or tested, a zero volt potential is maintained across the fuse 40. This eliminates the possibility of fuse regrowth after the fuse 40 has been blown or marginally blown.

The operational current source 62 is used for determining the state of the fuse 40. Preferably, one or more fuses 40 used to program the SLAC or SLAC family device will be blown during the manufacturing process. Thereafter, whenever the SLAC or SLAC family device is initialized, the state of each fuse 40 will be determined, preferably under control of the control circuit (not shown) in response to a predetermined sequence of instructions.

The state of the fuse 40 is determined by enabling the operational current source to apply current through the resistor 66 to the fuse 40. When the operational current source is enabled, switch 46 is open. If the fuse 40 is in its intact, uninterrupted state, the node 50 will be at approximately the ground potential of the ground node 48. The comparator 68 will detect that the fuse 40 is intact by measuring the voltage at the node 50. The comparator 68 will supply an appropriate output signal to the output 84 as described above.

The test current source 64 is used for detecting a marginally-blown condition of the fuse 40. In the marginally-blown state, the fuse 40 has a resistance intermediate the resistance of its intact state, for example 200 ohms, and the resistance of its blown state, for example 20 megohms. For example, in the marginally-blown state, the fuse 40 may have a resistance on the order of 10K ohms.

Referring back to FIG. 2, assume that all of the fuses are operating in a normal, non-blown state. With this non-blown state, all of the outputs Fuse0 through Fuse5 of the Fuse Registers 12 and 14 are at a logic "low" state, and all of the outputs Fuse0 through Fuse6 of the Fuse Registers 10 and 16 are at a logic "low" state. Thus, the output signal of the inverter 400 that is fed to the first input of the NAND Gate 360 is set initially at a logic "high" state.

Assume that the zeroth signal line (Fuse Enable signal) of the FSRDWR signal bus is set to a high state and at the same time the third signal line (Fuse Blow signal) of the FSRDWR signal bus is set to a high state, so as to blow particular fuses of the Fuse Registers 10, 12, 14 and 16. This results in the NAND Gate 360 receiving logic "high" values at each of its two inputs, which results in a logic "low" value at the output of the NAND Gate 360. The logic "low" value is inverted to a logic high value BLOW_H by the inverter 500, and that value is input to the respective BLOW inputs of each of the Fuse Registers 10, 12, 14 and 16. Note that the Blow6 input of the Fuse Register 16 is directly coupled to the third signal line of the FSRDWR signal bus. As a result, some or all of the fuses are blown, which results in a logic "high" state appearing at some or all of the Fuse0 through Fuse5 outputs of the Fuse Registers 12 and 14, a logic "high" state appearing at some or all of the Fuse0 through Fuse 6 outputs of the Fuse Register 10, and which results in a logic "high" state appearing at some or all of the Fuse0 through Fuse6 outputs of Fuse Register 16. Note that Fuse6 of Fuse Register 16 is blown at the this time due to the direct coupling of the third signal line of the FSRDWR signal bus to the Blow6 input. This results in a logic "high" state at the Fuse6 output of Fuse Register 16.

The logic "high" state of the Fuse6 output of Fuse Register 16 is fed to the inverter 500, which causes the first input of the NAND Gate 360 to be set to logic "low" state. Thus, regardless what the value of the third signal line of the FSRDWR signal bus (i.e., either logic "high" or logic "low"), the output of the NAND Gate 360 remains at the logic "high" state. As a consequence, the output BLOW_H of the inverter 500 remains at the logic "low" state, and thus the BLOW input to each of the Fuse Registers 10, 12, 14 and 16 stays at an inactive "low" state.

By blowing the sixth fuse of the Fuse Register 16 after trimming of selected fuses in the SLAC or SLAC family device (i.e., some or all of the other fuses in Fuse Registers 10, 12, 14 and 16), accidental blowing of any other fuses cannot occur. This is a result of the disabling of the respective BLOW inputs of the Fuse Registers 10, 12, 14 and 16 by the combination of the inverter 400, NAND Gate 360 and inverter 500 that are coupled between the Fuse6 output of the Fuse Register 16 and the BLOW inputs of each of the Fuse Registers 10, 12, 14 and 16.

The outputs of each of the Fuse Registers 10, 12, 14 and 16 are used to control particular functions and/or circuitry in the SLAC and other devices in the SLAC family. In particular, the Fuse0 through Fuse3 outputs of Fuse Register 10 are collectively denoted as the FC_VREF(3:0) lines, and they are used to set the reference voltage level needed by the SLAC and/or other devices in the SLAC family. The Fuse0 through Fuse2 outputs of Fuse Registers 12, 14 and 16 are collectively denoted as the FC_VNEG#(2:0) lines, and serve as signals used for setting a negative voltage value for the SLAC or other devices used in the SLAC family. The Fuse4 through Fuse6 outputs of Fuse Register 10 are collectively denoted as the FC_ADITRM2(2:0) lines, and they are used to set parameter values for the SLAC and/or devices in the SLAC family. The Fuse3 through Fuse5 outputs of Fuse Registers 12, 14 and 16 are collectively denoted as the FC_ADTERM#(2:0) lines, and they are used to set parameter values for the SLAC and/or devices in the SLAC family.

The actual use of these output signals by the SLAC and other devices in the SLAC family to set various parameter values in these devices is not important to the understanding of the fuse blowing and protection device 100 of the system according to the invention.

Figure 4:
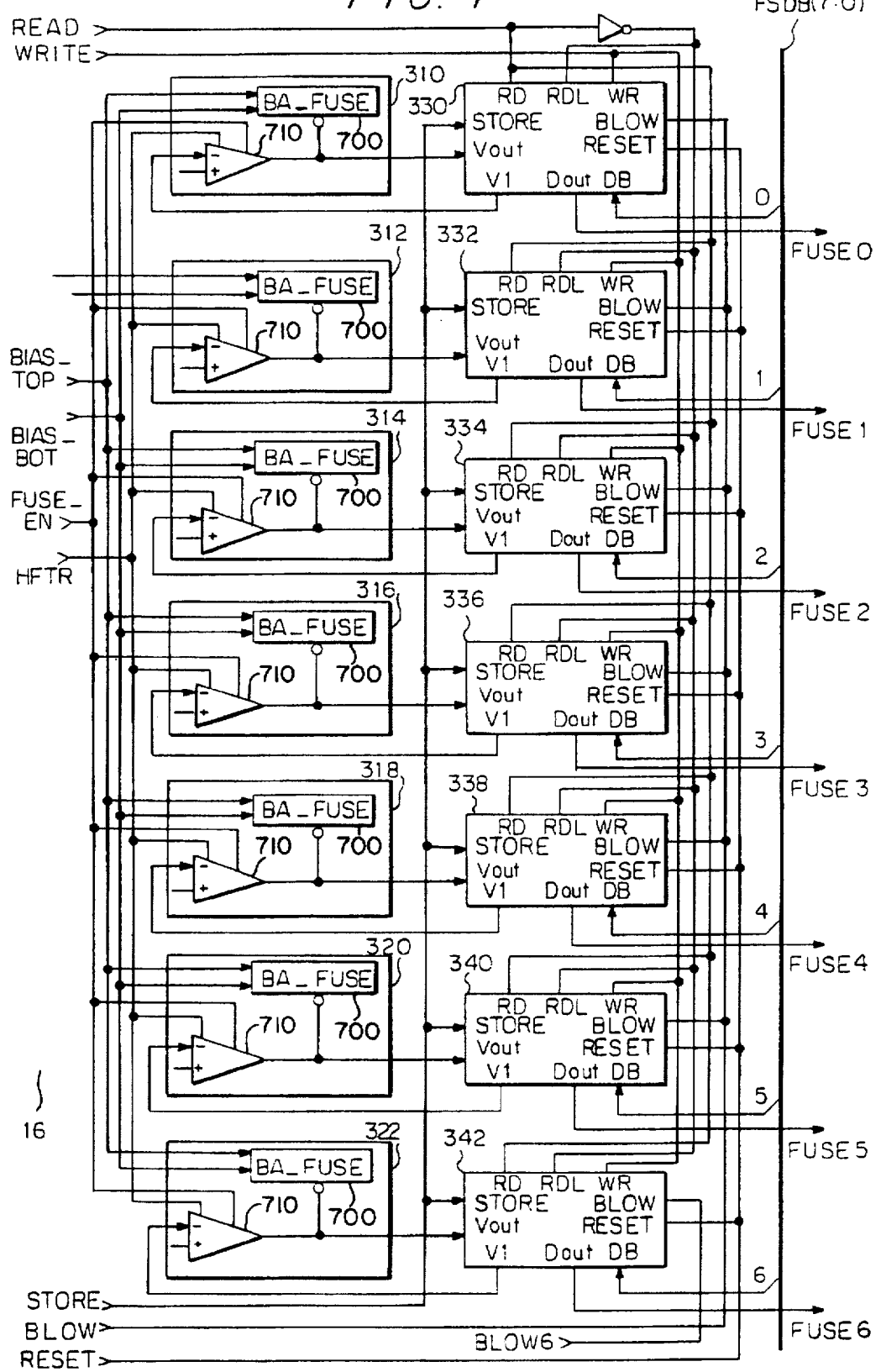
FIG. 4 shows a detailed diagram of a fuse register used in a fuse protection circuit according to the invention.

A more detailed diagram of the Fuse Register 16 of the system according to the invention is given in FIG. 4. Note that the fuse circuits shown in FIG. 4 are slightly different from the ones described in FIG. 2. However, either fuse circuit can be used in the fuse register to enable each of the fuses to be set to one of a blown state and an unblown state.

Fuse Register 16 includes first fuse circuits 310, 312, 314, 316, 318, 320, and 322. The first fuse circuits are respectively connected to the second fuse circuits 330, 332, 334, 336, 338, 340, and 342. Each of the first fuse circuits includes a comparator 710, as well as a fuse-adjusting circuit 700. Each fuse-adjusting circuit 700 is configured to receive the BIAS_TOP and BIAS_BOT signals output from the Fuse Bias Register 20 (see FIG. 2, for example). Each fuse-adjusting circuit 700 adjusts the output of the comparator 710 so that its voltage level is set to a value below the BIAS_TOP value and above the BIAS_BOT value. The HFTR input to the comparators 710 is used to adjust the gain of the comparators 710.

Each second fuse circuit is configured to receive data signals on the FSDB signal bus. The zeroth through sixth signal lines on the FSDB signal bus are respectively coupled to the DB input of the second fuse circuits 330, 332, 334, 336, 338, 340, and 342. That way, data is read into the second fuse circuits. The V1 outputs of the second fuse circuits are connected to respective negative inputs of comparator 710 in the corresponding first fuse circuits. Each second fuse circuit is also configured to receive a STORE signal (signal line 1 of the FSRDWR signal bus) on a STORE input.

The second fuse circuits 330, 332, 334, 336, 338, and 340 are configured to receive a BLOW signal (output signal BLOW_H of inverter 500 as shown in FIG. 2) on a BLOW input. Second fuse circuit 342 is configured differently, in that it receives a BLOW6 signal (signal line 3 of the FSRDWR signal bus) on its BLOW input. Note that the other Fuse Registers 10, 12, 14 do not have such differentiation between the signals fed to the respective BLOW inputs of their corresponding second fuse circuits, since each of these second fuse circuits is configured to receive the BLOW input (i.e., the BLOW_H output of the inverter 500, as seen in FIG. 2).

Referring back to the Fuse Register 16 (see FIG. 2), each second fuse circuit is configured to receive a RESET (RES) signal (shown as being coupled to a ground potential in FIG. 2) on a RESET input.

The Fuse Enable signal (signal line 0 of the FSRDWR signal bus) is connected to an ENB (Enable) input of the respective comparators 710 of each first fuse circuit. Each first fuse circuit also is configured to receive an HFTR signal (the second signal line of the FSRDWR signal bus), which is connected to an HFTR input of the respective operational amplifiers 700 of each first fuse circuit.

The READ and WRITE inputs to the Fuse Register 16 correspond to signal lines 6 and 7 of the FSRDWR signal bus, and are connected to respective RD and WR inputs of each second fuse circuit. These commands result in either reading data from or writing data into the second fuse circuits.

The output signal of the operational amplifier 710 of each of the first fuse circuits is connected to respective Vout input of the corresponding second fuse circuit (see FIG. 4).

With the configuration of the Fuse Register 16 as shown in FIG. 4, the extra fuse, which corresponds to the first fuse circuit 332 and the second fuse circuit 342, is utilized to provide a Fuse6 output signal that indicates whether this fuse has been blown or not. Based on the Fuse6 output signal being fed back to the inverter 400/NAND Gate 360/inverter 500 structure as shown in FIG. 2, accidental blowing of other fuses within Fuse Register 16 and within the other Fuse Registers 10, 12 and 14 is prevented to a great extent.

While there have been illustrated and described what is at present considered to be an exemplary embodiment according to the invention, it will be understood by those skilled in the art that various changes and modifications may be made, and equivalents may be substituted for elements thereof without departing from the true scope of the invention. In addition, many modifications may be made to adapt to a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fuse protection circuit, comprising:
    at least one fuse register configured to store and output a first plurality of fuse signals corresponding to a first plurality of fuses, said at least one fuse register having a fuse enable input and a blow fuse input, wherein said fuse signals are output to indicate a blown fuse condition when said fuse enable input and said blow fuse input are activated simultaneously; and a second fuse register configured to store and output a second plurality of fuse signals corresponding to a second plurality of fuses, said second plurality exceeding said first plurality by one, said second fuse register having a fuse enable input, a blow fuse input, and a blow extra fuse input, wherein all but one of said second plurality of fuse signals are output to indicate the blown fuse condition when said fuse enable input and said blow fuse input are activated simultaneously, and wherein a remaining one of said second plurality of fuse signals is output to indicate the blown fuse condition when said fuse enable input and said blow extra fuse input are activated simultaneously, and wherein said blow fuse input of said at least one fuse register and said second fuse register is respectively set to a value based on the remaining one of said second plurality of fuse signals.

2. A fuse protection circuit as recited in claim 1, further comprising a fuse bias circuit connected to said at least one fuse register and to said second fuse register, said fuse bias circuit configured to output a maximum bias signal and a minimum bias signal to said at least one fuse register and to said second fuse register.

3. A fuse protection circuit as recited in claim 1, wherein each of said at least one fuse register and said second fuse register includes a write input and a read input, wherein data is read from said at least one fuse register and said second fuse register when a read signal is set to an active state, wherein data is written into said at least one fuse register and said second fuse register when a write signal is set to an active state, and wherein said write signal and said read signal are sent to said at least one fuse register and said second fuse register via a signal bus from an external device.

4. A fuse protection circuit as recited in claim 1, wherein when the remaining one of said second plurality of fuse signals is set to a state indicating a blown fuse condition, said blow fuse input of said at least one fuse register and said second fuse register is respectively set to a first value which disallows any blowing of fuses.

5. A fuse protection circuit, comprising:

at least one fuse register configured to store and output a first plurality of fuse signals corresponding to a first plurality of fuses, said at least one fuse register having a fuse enable input, a blow fuse input, data read input and a data write input, wherein said fuse signals are output to indicate a blown fuse condition when said fuse enable input and said blow fuse input are activated simultaneously; and a second fuse register configured to store and output a second plurality of fuse signals corresponding to a second plurality of fuses, said second plurality exceeding said first plurality by one, said second fuse register having a fuse enable input, a blow fuse input, a data read input, a data write input, and a blow extra fuse input, wherein all but one of said second plurality of fuse signals are output to indicate the blown fuse condition when said fuse enable input and said blow fuse input are activated simultaneously, and wherein a remaining one of said second plurality of fuse signals is output to indicate the blown fuse condition when said fuse enable input and said blow extra fuse input are activated simultaneously, wherein said blow fuse input of said at least one fuse register and said second fuse register is respectively set to a value based on the remaining one of said second plurality of fuse signals, and wherein data read from and data written into said at least one fuse register and said second fuse register are used to indicate a current state of a corresponding one of said first and second plurality of fuses when said corresponding blow fuse input is not activated.

6. A fuse protection circuit as recited in claim 5, further comprising a fuse bias circuit connected to said at least one fuse register and to said second fuse register, said fuse bias circuit configured to output a maximum bias signal and a minimum bias signal to said at least one fuse register and to said second fuse register.

7. A fuse protection circuit as recited in claim 5, wherein each of said at least one fuse register and said second fuse register includes a write input and a read input, wherein data is read from said at least one fuse register and said second fuse register when a read signal is set to an active state, wherein data is written into said at least one fuse register and said second fuse register when a write signal is set to an active state, and wherein said write signal and said read signal are sent to said at least one fuse register and said second fuse register via a signal bus from an external device.

8. A fuse protection circuit as recited in claim 5, wherein when the remaining one of said second plurality of fuse signals is set to a state indicating a blown fuse condition, said blow fuse input of said at least one fuse register and said second fuse register is respectively set to a first value which disallows any blowing of fuses.

9. A fuse protection and fuse blowing circuit for a subscriber line audio processing circuit, comprising:

at least one fuse register configured to store and output a first plurality of fuse signals corresponding to a first plurality of fuses, said at least one fuse register having a fuse enable input and a blow fuse input, wherein said fuse signals are output to indicate a blown fuse condition when said fuse enable input and said blow fuse input are activated simultaneously; and a second fuse register configured to store and output a second plurality of fuse signals corresponding to a second plurality of fuses, said second plurality exceeding said first plurality by one, said second fuse register having a fuse enable input, a blow fuse input, and a blow extra fuse input, wherein all but one of said second plurality of fuse signals are output to indicate the blown fuse condition when said fuse enable input and said blow fuse input are activated simultaneously, and wherein a remaining one of said second plurality of fuse signals is output to indicate the blown fuse condition when said fuse enable input and said blow extra fuse input are activated simultaneously, and wherein said blow fuse input of said at least one fuse register and said second fuse register is respectively set to a value based on the remaining one of said second plurality of fuse signals.

10. A fuse protection and fuse blowing circuit as recited in claim 9, further comprising a fuse bias circuit connected to said at least one fuse register and to said second fuse register, said fuse bias circuit configured to output a maximum bias signal and a minimum bias signal to said at least one fuse register and to said second fuse register.

11. A fuse protection and fuse blowing circuit as recited in claim 9, wherein each of said at least one fuse register and said second fuse register includes a write input and a read input, wherein data is read from said at least one fuse register and said second fuse register when a read signal is set to an active state, wherein data is written into said at least one fuse register and said second fuse register when a write signal is set to an active state, and wherein said write signal and said read signal are sent to said at least one fuse register and said second fuse register via a signal bus from an external device.

12. A fuse protection and fuse blowing circuit as recited in claim 9, wherein when the remaining one of said second plurality of fuse signals is set to a state indicating a blown fuse condition, said blow fuse input of said at least one fuse register and said second fuse register is respectively set to a first value which disallows any blowing of fuses.

13. A fuse protection circuit, comprising:

at least one fuse register configured to store and output a first plurality of fuse signals corresponding to a first plurality of fuses, said at least one fuse register having a fuse enable input and a blow fuse input, wherein said fuse signals are output to indicate a blown fuse condition when said fuse enable input and said blow fuse input are activated simultaneously;

a second fuse register configured to store and output a second plurality of fuse signals corresponding to a second plurality of fuses, said second fuse register having a fuse enable input, a blow fuse input, and a blow extra fuse input, wherein all but one of said second plurality of fuse signals are output to indicate the blown fuse condition when said fuse enable input and said blow fuse input are activated simultaneously, and wherein a remaining one of said second plurality of fuse signals is output to indicate the blown fuse condition when said fuse enable input and said blow extra fuse input are activated simultaneously, and means for deactivating said blow fuse input to said first and second fuse registers after said the remaining one of said second plurality of fuse signals indicates the blown fuse condition.

14. A method of protecting a device from improperly entering a state in which a subset of a plurality of fuses are blown in order to set parameters for the device, said method comprising the steps of:

a) activating a first input signal to the device to blow the subset of the plurality of fuses;

b) activating a second input signal to the device to blow an extra fuse which can only be blown by activation of the second input signal; and c) once the extra fuse has been blown, feeding back a blown fuse signal from an output of the extra fuse to inputs of all of the plurality of fuses to maintain blown/unblown states of the plurality of fuses irrespective of the activation of the first input signal.

* * * * *